(12) United States Patent
Hashimoto et al.

(10) Patent No.: US 10,008,997 B2
(45) Date of Patent: Jun. 26, 2018

(54) FILTER GENERATOR, FILTER GENERATION METHOD, AND FILTER GENERATION PROGRAM

(71) Applicant: CLARION CO., LTD., Saitama-shi (JP)

(72) Inventors: Takeshi Hashimoto, Motomiya (JP); Tetsuo Watanabe, Hasuda (JP); Yasuhiro Fujita, Kashiwa (JP); Kazutomo Fukue, Kitamoto (JP); Takatomi Kumagai, Saitama (JP); Hideyuki Morita, Saitama (JP)

(73) Assignee: CLARION CO., LTD., Saitama-Shi (JP)

( * ) Notice: Subject to any disclaimer, the term of this patent is extended or adjusted under 35 U.S.C. 154(b) by 0 days. days.

(21) Appl. No.: 15/545,725

(22) PCT Filed: Feb. 24, 2016

(86) PCT No.: PCT/JP2016/055394
§ 371 (c)(1),
(2) Date: Jul. 24, 2017

(87) PCT Pub. No.: WO2016/140121
PCT Pub. Date: Sep. 9, 2016

(65) Prior Publication Data
US 2018/0019720 A1 Jan. 18, 2018

(30) Foreign Application Priority Data
Mar. 2, 2015 (JP) .................................. 2015-040443

(51) Int. Cl.
*H03G 5/16* (2006.01)
*H03G 5/00* (2006.01)

(52) U.S. Cl.
CPC ............. *H03G 5/165* (2013.01); *H03G 5/005* (2013.01)

(58) Field of Classification Search
None
See application file for complete search history.

(56) References Cited

U.S. PATENT DOCUMENTS

2002/0064291 A1* 5/2002 Kates ................... H04R 25/453
 381/318
2011/0113081 A1 5/2011 Teramoto et al.
(Continued)

FOREIGN PATENT DOCUMENTS

JP 2012-235303 11/2012
WO WO 2010/041381 4/2010

OTHER PUBLICATIONS

International Search Report for corresponding International Application No. PCT/JP2016/055394, dated May 24, 2016.

*Primary Examiner* — Paul Huber
(74) *Attorney, Agent, or Firm* — Mori & Ward, LLP

(57) ABSTRACT

A filter generator (100) generates a filter on the basis of band information (frequency) and gain characteristics (gain value) set by a user. The filter generator (100) obtains weighting factor information on the basis of the band information selected by the user and calculates a gain difference between a gain value used in a preceding filtering process and the new gain value selected by the user. The filter generator (100) then obtains a correction gain by multiplying the weighting factor information by the gain difference and generates a filter by multiplying a coefficient of the filter used in the preceding filtering process by the correction gain.

10 Claims, 8 Drawing Sheets

(56) References Cited

U.S. PATENT DOCUMENTS

2012/0191447 A1* 7/2012 Joshi .................. G10L 21/0208
704/226
2015/0317995 A1* 11/2015 De Vries ............... G10L 19/265
704/206

* cited by examiner

FILTER GENERATOR, FILTER GENERATION METHOD, AND FILTER GENERATION PROGRAM

TECHNICAL FIELD

The present invention relates to a filter generator, filter generation method, and filter generation program. More specifically, the present invention relates to a filter generator, filter generation method, and filter generation program that generate a filter for performing sound processing on an input audio signal by fast-Fourier-transforming, then filtering, and inverse-fast-Fourier-transforming the audio signal.

BACKGROUND ART

There has been known a method of correcting the sound field in the listening environment by filtering an acoustic signal outputted from a speaker or the like. At the present time, an infinite impulse response (IIR) filter and finite impulse response (FIR) filter are widely known as digital filters used in filtering.

If the gain of a desired frequency band is set in order to filter a signal using an IIR filter, the set gain of the frequency band can be relatively easily adjusted. However, an IIR filter performs a feedback loop process as an internal process and therefore accumulates arithmetic errors, deteriorating the arithmetic accuracy. On the other hand, an FIR filter performs one multiplication and one addition on each delayed signal for each coefficient of a filter as an internal process and therefore is characterized in that it does not accumulate arithmetic errors and has high arithmetic accuracy. However, in the case of an FIR filter, unlike an IIR filter, it is difficult to generate a filter by partially changing the frequency characteristics of the FIR filter (by changing a particular portion of the frequency characteristics). For this reason, even if the gain of a desired frequency band is set, it is not easy to adjust the set gain of the frequency band using an FIR filter. Accordingly, an FIR filter has a problem of having less adjustability than an IIR filter.

To solve this problem, there have been developed signal processing circuits that have both the adjustability of an IIR filter and the high accuracy of an FIR filter, which accumulates less arithmetic errors (for example, see Patent Literature 1).

CITATION LIST

Patent Literature

PTL 1: WO 2010/041381

SUMMARY OF INVENTION

Technical Problem

A signal processing circuit disclosed in Patent Literature 1 has two filters consisting of an IIR filter and an FIR filter that have always equivalent transfer functions. When the adjustment mode in which the transfer functions are adjusted is selected, this signal processing circuit adjusts the configuration or setting of the IIR filter; when the adjustment is complete or when the signal processing mode is selected, the signal processing circuit generates the FIR filter having the same transfer function as that of the IIR filter and changes the IIR filter to the FIR filter.

However, this signal processing circuit must change the configuration to the FIR filter having the equivalent transfer function after making a setting to the configuration of the IIR filter once. For this reason, this signal processing circuit has a problem of increasing the processing load of calculation and reducing the processing speed.

An IIR filter allows the gain of a desired frequency band to be easily adjusted and thus is often used in a graphic equalizer or the like. A graphic equalizer includes a setting screen for displaying the gains set for the bands, and many graphic equalizers use bar display (bar chart display) to display the gains set for the bands. Thus, the user can change the frequency characteristics of bass or treble while viewing the display of the setting screen.

Among known IIR filters are low-pass filters, which pass low frequencies, high-pass filters, which pass high frequencies, and peaking filters, which pass particular frequencies. A graphic equalizer adjusts the gain of a desired frequency band and therefore typically uses a peaking filter. However, if a graphic equalizer adjusts the gains of the respective bands using a peaking filter, the gain outputs of adjacent bands form a trough, as shown in FIG. 14 of Japanese Unexamined Patent Application Publication No. 2012-235303. Thus, there occur differences between the gain characteristics of the respective frequency bands set on the basis of the setting screen and the gain characteristics of the actually filtered frequency bands. For this reason, if the gains are corrected using an IIR filter, a less accurate filter may be generated.

By using an FIR filter rather than an IIR filter, a filter having high arithmetic accuracy may be generated. However, as described above, an FIR filter has difficulty in generating a filter by partially changing the frequency characteristics (by changing only a particular portion of the frequency characteristics). That is, an FIR filter has less adjustability, as well as has difficulty in generating a filter quickly.

The present invention has been made in view of the above problems, and an object thereof is to provide a filter generator, filter generation method, and filter generation program that when the gain of a particular frequency band is set or changed, quickly and accurately generate an FIR filter that realizes the characteristics of the set or changed gain of the frequency band.

Solution to Problem

To solve the problems, a filter generator of one aspect of the present invention is a filter generator that generates a filter for performing a sound correction process on an audio signal by fast-Fourier-transforming, then filtering, and inverse-fast-Fourier-transforming the audio signal. The filter generator includes a weighting factor storage unit configured to store weighting factor information used to perform the sound correction process, for each of a plurality of bands obtained by dividing a frequency band of the audio signal, a gain coefficient storage unit configured to store preceding gain values of the divided bands set by a user before a preceding sound correction process and a preceding filter used in the preceding sound correction process, an input detection unit configured to detect a band selected by the user, of the divided bands as band information and to detect a new gain value newly set by the user for the selected band, a weighting factor extraction unit configured to extract weighting factor information of the band selected by the user from the weighting factor storage unit on the basis of the band information detected by the input detection unit, a gain difference calculation unit configured to calculate, as a gain difference, a difference between a preceding gain value of the band obtained from the band information, of the preceding gain values stored in the gain coefficient storage unit and the new gain value detected by the input detection unit, a correction gain generation unit configured to generate a correction gain of the band obtained from the band information by multiplying the weighting factor information extracted by the weighting factor extraction unit and the gain difference calculated by the gain difference calculation unit, and a filter coefficient calculation unit configured to generate a new filter by multiplying a coefficient of the band obtained from the band information, of the preceding filter stored in the gain coefficient storage unit by the correction gain generated by the correction gain generation unit.

A filter generation method of another aspect of the present invention is a filter generation method used by a filter generator that generates a filter for performing a sound correction process on an audio signal by fast-Fourier-transforming, then filtering, and inverse-fast-Fourier-transforming the audio signal. The filter generator includes a weighting factor storage unit configured to store weighting factor information used to perform the sound correction process, for each of a plurality of bands obtained by dividing a frequency band of the audio signal and a gain coefficient storage unit configured to store preceding gain values of the divided bands set by a user before a preceding sound correction process and a preceding filter used in the preceding sound correction process. The filter generation method includes an input detection step of detecting, by an input detection unit, a band selected by the user, of the divided bands as band information and detecting a new gain value newly set by the user for the selected band, a weighting factor extraction step of extracting, by a weighting factor extraction unit, weighting factor information of the band selected by the user from the weighting factor storage unit on the basis of the band information detected in the input detection step, a gain difference calculation step of calculating, by a gain difference calculation unit, a difference between a preceding gain value of the band obtained from the band information, of the preceding gain values stored in the gain coefficient storage unit and the new gain value detected in the input detection step, as a gain difference, a correction gain generation step of generating, by a correction gain generation unit, a correction gain of the band obtained from the band information by multiplying the weighting factor information extracted in the weighting factor extraction step and the gain difference calculated in the gain difference calculation step, and a filter coefficient calculation step of generating, by a filter coefficient calculation unit, a new filter by multiplying a coefficient of the band obtained from the band information, of the preceding filter stored in the gain coefficient storage unit by the correction gain generated in the correction gain generation step.

A filter generation program of yet another aspect of the present invention is a filter generation program for performing, using a computer of a filter generator, a function of generating a filter for performing a sound correction process on an audio signal by fast-Fourier-transforming, then filtering, and inverse-fast-Fourier-transforming the audio signal. The filter generator includes a weighting factor storage unit configured to store weighting factor information used to perform the sound correction process, for each of a plurality of bands obtained by dividing a frequency band of the audio signal and a gain coefficient storage unit configured to store preceding gain values of the divided bands set by a user before a preceding sound correction process and a preceding filter used in the preceding sound correction process. The filter generation program causes the computer to perform an input detection function of detecting a band selected by the user, of the divided bands as band information and detecting a new gain value newly set by the user for the selected band, a weighting factor extraction function of extracting weighting factor information of the band selected by the user from the weighting factor storage unit on the basis of the band information detected by the input detection function, a gain difference calculation function of calculating, as a gain difference, a difference between a preceding gain value of the band obtained from the band information, of the preceding gain values stored in the gain coefficient storage unit and the new gain value detected by the input detection function, a correction gain generation function of generating a correction gain of the band obtained from the band information by multiplying the weighting factor information extracted by the weighting factor extraction function and the gain difference calculated by the gain difference calculation function, and a filter coefficient calculation function of generating a new filter by multiplying a coefficient of the band obtained from the band information, of the preceding filter stored in the gain coefficient storage unit by the correction gain generated by the correction gain generation function.

According to the filter generator, filter generation method, and filter generation program, the correction gain for correcting the band selected by the user can be obtained by multiplying the weighting factor information by the gain difference. The coefficient of the band selected by the user, of the filter used in the preceding filtering process is multiplied by this correction gain. Thus, of coefficients of all the frequency bands, only the coefficient of the frequency band to be corrected can be updated. This eliminates the need to newly calculate all coefficients, unlike a conventional FIR filter. Thus, it is possible to reduce the processing load such as the calculation of coefficients of a filter, to reduce the processing time, and to speed up the processing.

According to the filter generator, filter generation method, and filter generation program, the generated new filter is used to perform the sound correction process on the audio signal by fast-Fourier-transforming, then filtering, and inverse-fast-Fourier-transforming the audio signal. Since the audio signal is converted into a frequency-domain signal by the fast Fourier transform process and then filtered, an FIR filter is used in the filtering process. Thus, the accuracy of a correction process using filter calculation can be improved compared to when performing a sound correction process using an IIR filter.

In the filter generator, filter generation method, and filter generation program, the weighting factor information may be set in such a manner that an amplitude value of a center frequency of each of the divided bands is set to a maximum value; and amplitude values become lower at more distant frequencies from the center frequency and show a convex amplitude value change state.

By setting the weighting factor information in such a manner that the amplitude value of the center frequency of each of the divided bands is set to the maximum value; and the amplitude values become lower at more distant frequencies from the center frequency and show the convex amplitude value change state, it is possible to adjust the gain without affecting the gain value of the adjacent band while reliably increasing or reducing the gain value of the central portion of each of the divided bands.

In the filter generator, filter generation method, and filter generation program, if a frequency is represented by a log scale, the convex amplitude value change state may have a horizontally symmetrical shape in the weighting factor information.

If the frequency is represented by a log scale and the weighting factor information shows a horizontally symmetrical, convex amplitude value state, the gains of all the frequencies in the selected band can be corrected in balance.

In the filter generator, filter generation method, and filter generation program, the weighting factor information may be set in such a manner that an amplitude value of a center frequency of an adjacent band is set to 0; and an amplitude value of a frequency serving as a boundary with the adjacent band is set to an amplitude value that is half of the maximum value.

By setting, for each of the bands, the weighting factor information in such a manner that the amplitude value of the center frequency is set to the maximum value; the amplitude value of the center frequency of the adjacent band is set to 0; the amplitude value of the frequency serving as the boundary with the adjacent band is set to the amplitude value that is half of the maximum value; and the amplitude values continuously change in a convex shape, even if the gain value of the band selected by the user is set or changed, it is possible to reliably increase or reduce the gain of the boundary while minimizing the influence on the gain value of the adjacent frequency band. Thus, a trough based on the gain value can be prevented from occurring in the adjacent band like when correcting the gain value using an IIR filter. Also, it is possible to accurately reproduce the gain characteristics of the frequency bands set by the user and to improve the accuracy of sound correction.

In the filter generator, filter generation method, and filter generation program, the weighting factor information may have attenuation characteristics corresponding to a Hann window or quarter window as the convex amplitude value change state.

If the weighting factor information has attenuation characteristics corresponding to a Hann window or quarter window as the convex amplitude value change state, the filter characteristics of the generated filter can be made filter characteristics having gain variations that are continuous as a whole while suppressing the influence on the gain variations of the adjacent band.

Advantageous Effects of Invention

According to the filter generator, filter generation method, and filter generation program, the correction gain for correcting the band selected by the user can be obtained by multiplying the weighting factor information by the gain difference. The coefficient of the band selected by the user, of the filter used in the preceding filtering process is multiplied by this correction gain. Thus, of coefficients of all the frequency bands, only the coefficient of the frequency band to be corrected can be updated. This eliminates the need to newly calculate all coefficients, unlike a conventional FIR filter. Thus, it is possible to reduce the processing load such as the calculation of coefficients of a filter, to reduce the processing time, and to speed up the processing.

BRIEF DESCRIPTION OF DRAWINGS

FIG. 3($b$) is a diagram showing an example of a generated new filter;

FIG. 6($b$) shows an example of the frequency characteristics of a new filter generated in the state of FIG. 6($a$);

FIG. 7($b$) shows an example of the frequency characteristics of a new filter generated in the state of FIG. 7($a$); FIG. 8($b$) shows an example of the frequency characteristics of a new filter generated in the state of FIG. 8($a$).

DESCRIPTION OF EMBODIMENTS

Figure 1:
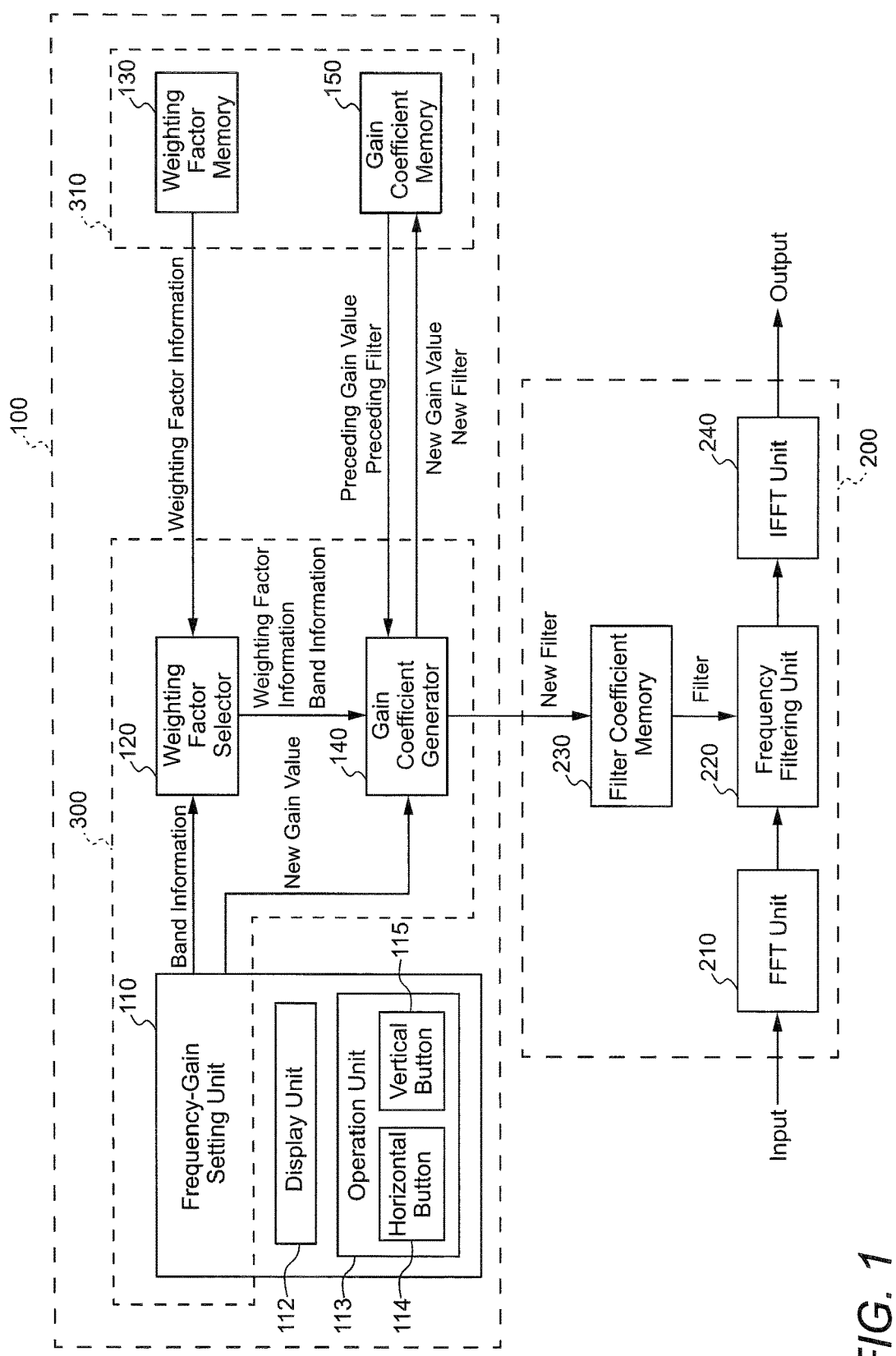
FIG. 1 is a block diagram showing schematic configurations of a filter generator and a sound field corrector in an embodiment.

Now, an example of a filter generator of the present invention will be described in detail with reference to the drawings. FIG. 1 shows schematic configurations of a filter generator 100 and a sound field corrector 200 in an embodiment. The filter generator 100 generates a filter (FIR filter) for correcting the gain of a band selected by the user. The sound field corrector 200 performs a sound correction process on an audio signal using the filter generated by the filter generator 100.

Sound Field Corrector

First, the configuration of the sound field corrector 200 will be described. The sound field corrector 200 includes an FFT (fast Fourier transform, short-time Fourier transform) unit 210, a frequency filtering unit 220, a filter coefficient memory 230, and an IFFT (inverse fast Fourier transform, short-time inverse Fourier transform) unit 240.

FFT Unit

The FFT unit 210 samples an audio signal received from a sound source (not shown) into a discrete time signal and then Fourier-transforms the discrete time signal. More specifically, the FFT unit 210 overlaps the audio signal and weights it using a window function, and then short-time-Fourier-transforms the resulting audio signal, thereby converting the time-domain audio signal into a frequency-domain signal. The FFT unit 210 then outputs a frequency spectrum signal consisting of a real number and imaginary number. In the present embodiment, sampling and short-time Fourier transform are performed, for example, on the following conditions: the sampling frequency is 96 kHz; the Fourier transform length is 16,384 samples; the overlap length is 12,288 samples; the window function is a Hanning window; and the time is shifted every 4,096 samples. In this case, a frequency spectrum signal of 16,384 points is obtained. The FFT unit 210 outputs a frequency spectrum signal having 8,193 points corresponding to a Nyquist frequency range from 0 Hz to 48 kHz, of 16,384 points.

Filter Coefficient Memory

The filter coefficient memory 230 stores a filter (new filter) generated by the filter generator 100. More specifically, the filter coefficient memory 230 stores the new filter generated by a gain coefficient generator 140 (to be discussed later) in such a manner that the frequency filtering unit 220 can read the new filter. The filter (new filter) stored in the filter coefficient memory 230 is stored as coefficients for a filter corresponding to all the bands of the frequency spectrum signal outputted by the FFT unit 210. Thus, the frequency filtering unit 220 can read the filter from the filter coefficient memory 230 and filter the frequency spectrum signal using an FIR filter. Note that the filter stored in the filter coefficient memory 230 is periodically updated by the gain coefficient generator 140.

Frequency Filtering Unit

The frequency filtering unit 220 weights the frequency spectrum signal on the basis of the filter (new filter) stored in the filter coefficient memory 230. More specifically, the frequency filtering unit 220 performs filtering in the frequency domain by multiplying the frequency spectrum signal outputted from the FFT unit 210 by the filter stored in the filter coefficient memory 230. The frequency filtering unit 220 then outputs the weighted frequency spectrum signal.

IFFT Unit

The IFFT unit 240 converts the weighted frequency spectrum signal into a time-domain audio signal. More specifically, the IFFT unit 240 converts the weighted frequency spectrum signal, which is a frequency-domain signal, into a time-domain audio signal by short-time inverse-Fourier-transforming the frequency spectrum signal and then performing window-function weighting and overlap-addition on the resulting signal. Thus, the IFFT unit 240 outputs the audio signal that has been subjected to frequency-domain gain correction (frequency characteristics correction) by the frequency filtering unit 220 in the filtering process. The audio signal outputted from the IFFT unit 240 is outputted from a speaker or the like (not shown).

Filter Generator

Next, the configuration of the filter generator 100 will be described. As shown in FIG. 1, the filter generator 100 includes a frequency-gain setting unit (input detection unit) 110, a weighting factor selector (weighting factor extraction unit) 120, a weighting factor memory (weighting factor storage unit) 130, a gain coefficient generator (gain difference calculation unit, correction gain generation unit, filter coefficient calculation unit) 140, and a gain coefficient memory (gain coefficient storage unit) 150. The function units (frequency-gain setting unit 110, weighting factor selector 120 and gain coefficient generator 140) of the filter generator 100 perform a filter generation process in accordance with a flowchart shown in FIG. 2.

Frequency-Gain Setting Unit

Figure 3A:
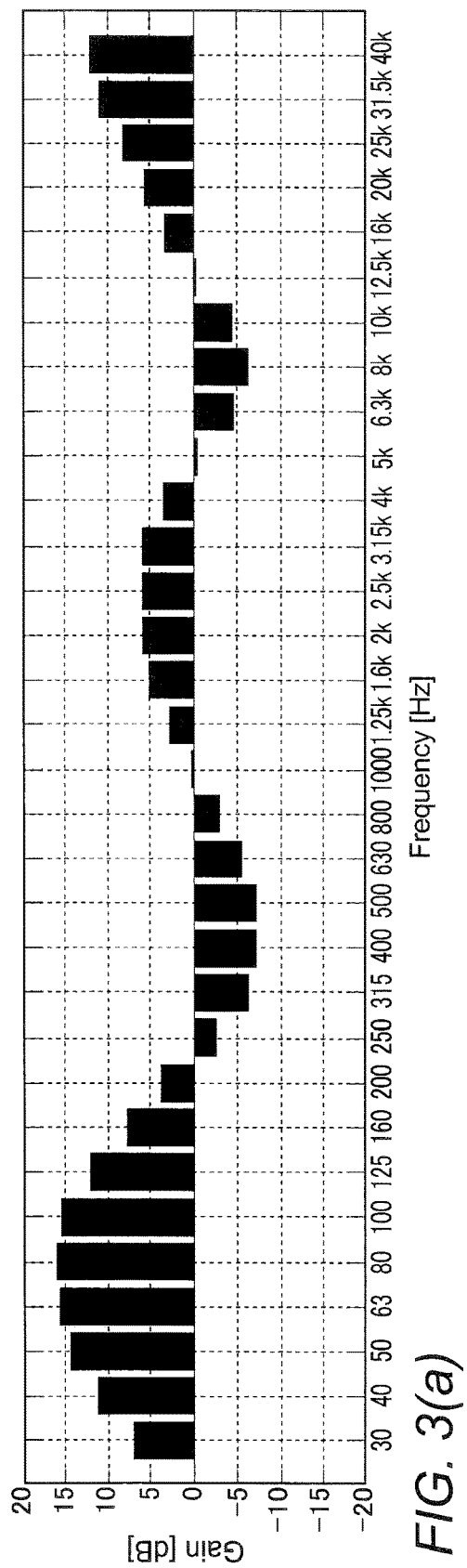
FIG. 3($a$) is a diagram showing an example display of a display unit of the embodiment.

The frequency-gain setting unit 110 includes a display unit 112 and an operation unit 113. For example, as shown in FIG. 3(a), the horizontal axis of the display unit 112 represents a frequency band which is divided into multiple bands (Hz), and the vertical axis represents gains (dB) set for the bands. More specifically, the horizontal axis of FIG. 3(a) represents a frequency band that ranges from 30 Hz to 40 kHz and is divided into 32 bands by ⅓ octave. The vertical axis of FIG. 3(a) represents an adjustable gain range. In FIG. 3(a), a gain of up to ±20 dB can be shown in the adjustable range.

The operation unit 113 includes a horizontal button 114 and a vertical button 115. The user can select one of the 32 bands of the frequency band by operating the horizontal button 114. When the user operates the horizontal button 114, the band to be selected (e.g., the band whose gain bar is focused on the display unit 112) moves to adjacent other bands (the focused bar moves to adjacent bands). Also, the user can change the gain value of the focused band by operating the vertical button 115. When the vertical button 115 is depressed, the length of the gain bar is changed in accordance with the degree of depression of the button. The user can change the frequency characteristics of the desired frequency band by operating the operation unit 113 to set or change the gain of the desired band while viewing the setting screen of the display unit 112.

While, in the present embodiment, the horizontal button 114 and vertical button 115 constitute the operation unit 113, a touchscreen, for example, may serve as both the display unit 112 and operation unit 113. In this case, the user can select a band and set or change the gain thereof by touching the touchscreen while viewing the display screen.

Figure 2:
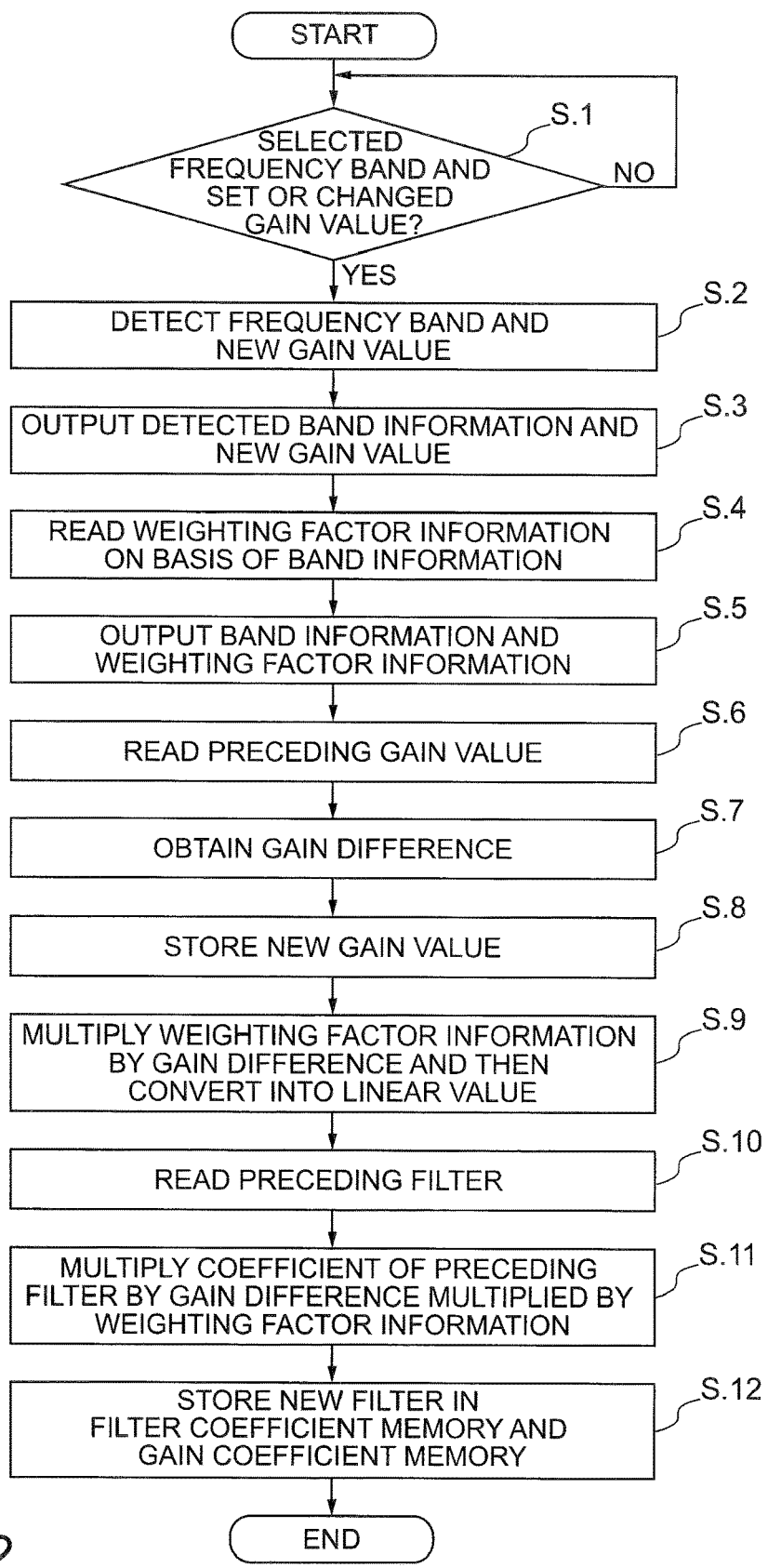
FIG. 2 is a flowchart showing a process performed by the filter generator of the embodiment.

The frequency-gain setting unit 110 determines whether the user has newly selected a frequency band and set or changed the gain thereof by operating the operation unit 113 (step S.1 in FIG. 2). If it determines that the user has not selected a frequency band or set or changed the gain (No in step S.1 in FIG. 2), the frequency-gain setting unit 110 repeatedly determines whether the user has newly selected a frequency band and set or changed the gain, on the basis of an operation of the operation unit 113. The frequency-gain setting unit 110 may periodically (at predetermined time intervals) determine whether the user has newly selected a frequency band and set or changed the gain. By making such determination, for example, every 0.1 sec, the frequency-gain setting unit 110 can quickly detect that the user has made a setting or change, without preventing the user from smoothly operating the operation unit 113.

If it determines that the user has selected a frequency band and set or changed the gain (Yes in step S.1 in FIG. 2), the frequency-gain setting unit 110 detects the selected frequency band and the set new gain value (step S.2 in FIG. 2: input detection step, input detection function). The frequency-gain setting unit 110 then outputs the detected band information (information about the frequency band) to the weighting factor selector 120 and outputs the set new gain value to the gain coefficient generator 140 (step S.3 in FIG. 2).

Weighting Factor Selector

The weighting factor selector 120 reads weighting factor information of corresponding band information from the weighting factor memory 130 on the basis of the band information received from the frequency-gain setting unit 110 (step S.4 in FIG. 2: weighting factor extraction step, weighting factor extraction function). The weighting factor selector 120 then outputs the band information and the read weighting factor information to the gain coefficient generator 140 (step S.5 in FIG. 2).

Weighting Factor Memory

Figure 4A:
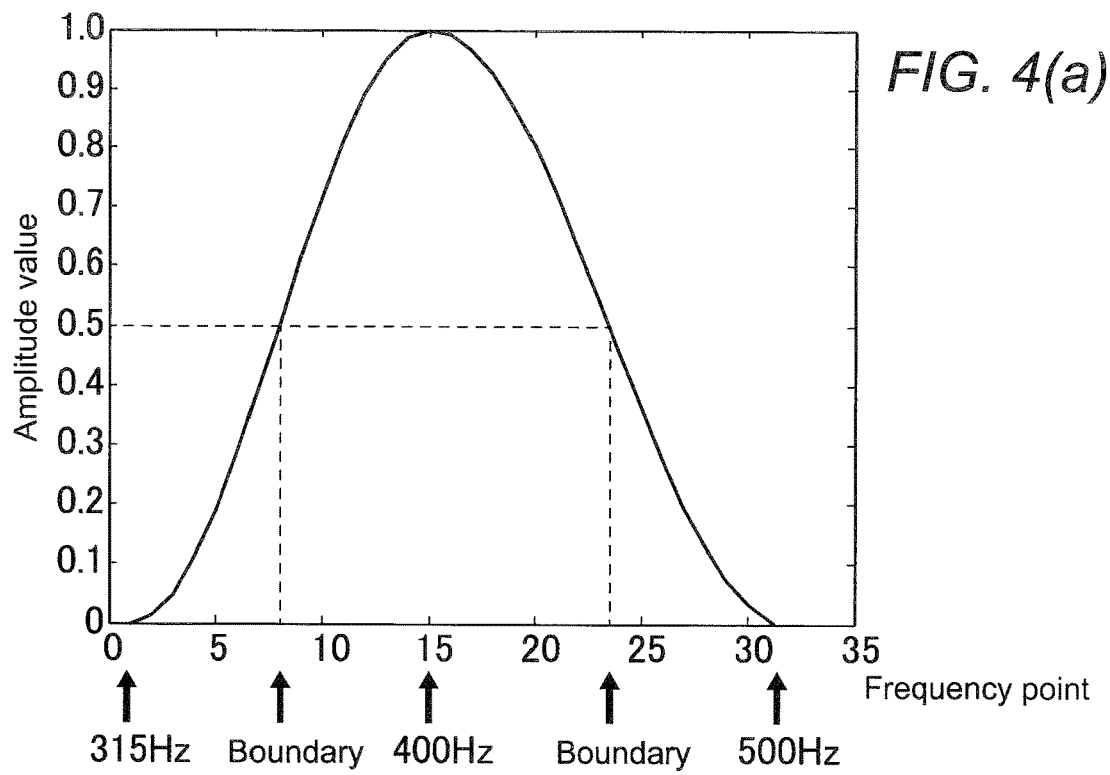
FIG. 4($a$) and FIG. 4($b$) includes diagrams showing an example of weighting factor information used in the embodiment.
Figure 4B:
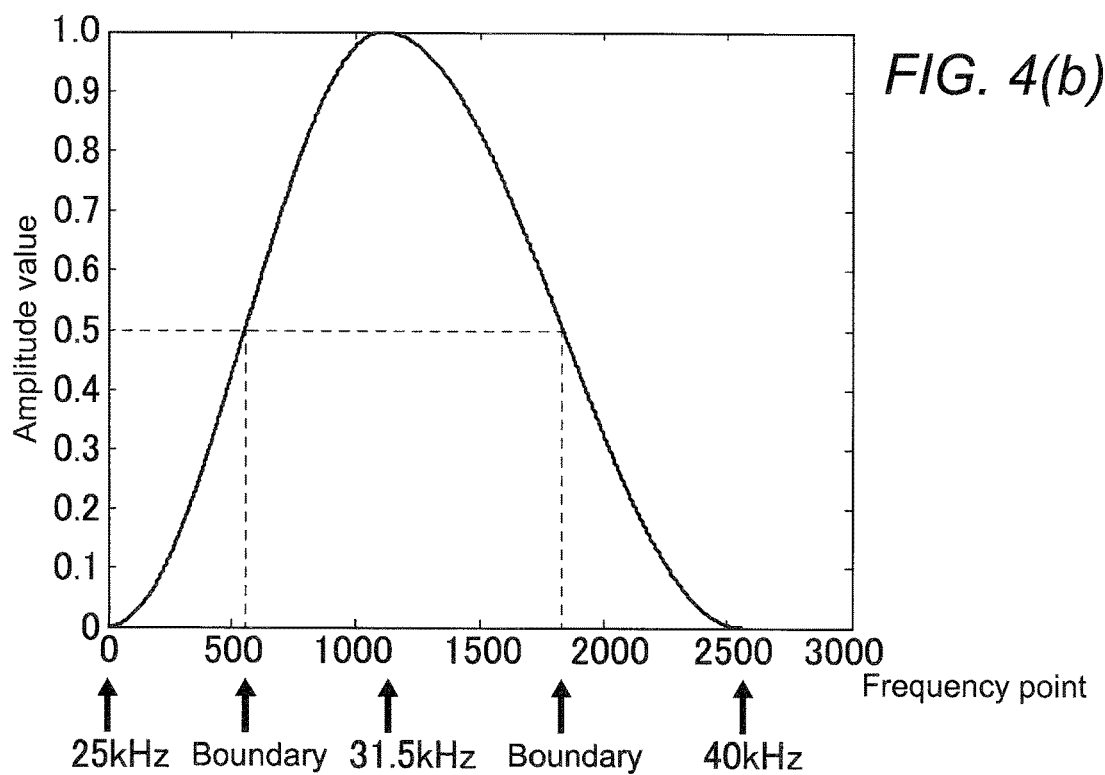

The weighting factor memory 130 stores weighting factor information corresponding to the 32 bands displayed in a divided manner on the display unit 112 of the frequency-gain setting unit 110. FIG. 4(a) shows an example of the weighting factor information of a band whose center frequency is 400 Hz stored in the weighting factor memory 130. FIG. 4(b) shows an example of the weighting factor information of a band whose center frequency is 31.5 kHz. Weighting factor information is information preset for each band. As shown in FIGS. 4(a) and 4(b), weighting factor information is set in such a manner that the amplitude value (a value on the vertical axis in FIGS. 4(a) and 4(b)) of the center frequency of the frequency points (the values on the horizontal axis in FIGS. 4(a) and 4(b)) is set to 1; and the amplitude values of more distant frequencies from the center frequency are continuously reduced. In the present embodiment, as shown in FIGS. 4(a) and 4(b), the amplitude value of the weighting factor information is set using the attenuation curve of the Hann window.

The number (frequency point) on the horizontal axis of FIGS. 4(a) and 4(b) corresponds to the number of coefficients of a filter of each band. In FIG. 4(a), the number on the horizontal axis corresponding to frequencies from 315 Hz to 500 Hz corresponds to the number of coefficients, 31. In FIG. 4(b), the number on the horizontal axis corresponding to frequencies from 25 kHz to 40 kHz corresponds to the number of coefficients, 2,560. Also, the approximately convex graphs of the weighting factor information shown in FIGS. 4(a) and 4(b) are represented in a linear scale and therefore is horizontally asymmetrical on the horizontal axis. On the other hand, if the weighting factor information is graphed in a log scale, a horizontally symmetrical graph is formed. That is, if the frequency is represented in a log scale, the weighting factor information shows a horizontally symmetrical, convex amplitude value change state. Thus, the gains of all frequencies in the band selected by the user can be corrected in balance.

In the weighting factor information, the amplitude value of the highest frequency (frequency point) and the amplitude value of the lowest frequency (frequency point) are both set to 0. The frequencies (frequency points) whose amplitude values are 0 serve as the center frequencies of bands adjacent to the band selected by the user. Also, in the weighting factor information, the amplitude values of frequencies serving as the boundaries between the band selected by the user and the adjacent bands are set to 0.5.

More detailed description will be made. As described above, the frequency band to be corrected is divided into 32 bands by ⅓ octave. For example, bands adjacent to a band whose center frequency is 400 Hz are a band whose center frequency is 315 Hz and a band whose center frequency is 500 Hz. In the weighting factor information of the band whose center frequency is 400 Hz, as shown in FIG. 4(a), frequencies whose amplitude values are set to 0 are 315 Hz and 500 Hz. 315 Hz corresponds to the center frequency of the adjacent band having lower frequencies than the band whose center frequency is 400 Hz; 500 Hz corresponds to the center frequency of the adjacent band having higher frequencies than the band whose center frequency is 400 Hz.

Similarly, in the weighting factor information of the band whose center frequency is 31.5 kHz, as shown in FIG. 4(b), frequencies whose amplitude values are set to 0 are 25 kHz and 40 kHz. 25 kHz corresponds to the center frequency of the adjacent band having lower frequencies than the band whose center frequency is 31.5 kHz; 40 kHz corresponds to the center frequency of the adjacent band having higher frequencies than the band whose center frequency is 31.5 kHz.

In FIG. 4(a), the amplitude value of a frequency serving as the boundary between the band whose center frequency is 400 Hz and the band whose center frequency is 315 Hz is set to 0.5. The amplitude value of a frequency serving as the boundary between the band whose center frequency is 400 Hz and the band whose center frequency is 500 Hz is also set to 0.5. Similarly, in FIG. 4(b), the amplitude value of a frequency serving as the boundary between the band whose center frequency is 31.5 kHz and the band whose center frequency is 25 kHz is set to 0.5. The amplitude value of a frequency serving as the boundary between the band whose center frequency is 31.5 kHz and the band whose center frequency is 40 kHz is also set to 0.5.

As seen above, the amplitude value of the center frequency is set to 1; the amplitude values of the frequencies serving as the boundaries are set to 0.5; and the amplitude values of the respective frequencies are set so as to continuously change in an approximately convex shape. Thus, when the user increases or reduces the gain of one of the divided 32 bands, the gain value of the center frequency of the increased or reduced band is reliably increased or reduced, as well as the gain values of the boundaries of the increased or reduced band is changed in conjunction with the gain value of the center frequency so that a feeling of strangeness does not occur. Also, by setting the amplitude values of the center frequencies of the adjacent bands to 0, the gain value of the increased or reduced band can be changed without affecting the gain values of the center frequencies of the bands adjacent to the increased or reduced band.

Gain Coefficient Generator/Gain Coefficient Memory

The gain coefficient generator 140 obtains, as a gain difference, the difference between the newly updated gain value (new gain value) of the band selected by the user and the gain value thereof preceding the update. The gain coefficient memory 150 stores, as preceding gain values, gain values of the divided bands detected before the new gain value is detected by the frequency-gain setting unit 110. In other words, the gain coefficient memory 150 stores, as preceding gain values, the gain values of the divided bands set by the user before a preceding sound correction process. The gain coefficient memory 150 also stores, as a preceding filter, the filter used by the frequency filtering unit 220 in the preceding sound correction process (that is, the same filter as that stored in the filter coefficient memory 230).

The gain coefficient generator 140 determines the frequency band selected by the user on the basis of the band information received from the weighting factor selector 120. The gain coefficient generator 140 also determines the gain value set by the user on the basis of the new gain value received from the frequency-gain setting unit 110. The gain coefficient generator 140 then reads, as "a preceding gain value", a gain value corresponding to the frequency band obtained from the band information from among the gain values of the bands stored in the gain coefficient memory 150 (step S.6 in FIG. 2). The gain coefficient generator 140 then obtains, as a gain difference, the difference between the "new gain value" set by the user and the "preceding gain value" read from the gain coefficient memory 150 (step S.7 in FIG. 2: gain difference calculation step, gain difference calculation function).

The gain coefficient generator 140 then stores the new gain value obtained from the frequency-gain setting unit 110 in the gain coefficient memory 150 as the "new gain value" of the band obtained from the band information (step S.8 in FIG. 2). The "new gain value" stored in the gain coefficient memory 150 will be used as a "preceding gain value" when an operation of the operation unit 113 is newly detected; it is determined that the user has selected a band and set or changed the gain (step S.1 in FIG. 2); and then a gain value is newly read from the gain coefficient memory 150 (step S.6 in FIG. 2).

The gain coefficient generator 140 multiplies the weighting factor information read from the weighting factor selector 120 and the gain difference and then converts the resulting decibel value into a linear value (step S.9 in FIG. 2: correction gain generation step, correction gain generation function). The gain coefficient generator 140 then reads the preceding filter from the gain coefficient memory 150 (step S.10 in FIG. 2) and multiplies the coefficient of the read preceding filter by the gain difference multiplied by the weighting factor information (correction gain) (step S.11 in FIG. 2: filter coefficient calculation step, filter coefficient calculation function). Note that the preceding filter is a filter that is stored in the gain coefficient memory 150 and that has been used in the preceding sound correction process (a filtering process performed by the frequency filtering unit 220).

As used herein, the "gain difference multiplied by the weighting factor information (correction gain)" refers to a gain for correcting the band obtained from the band information. For this reason, of the preceding filter, only the coefficient of the filter of the band obtained from the band information is multiplied by the correction gain. The new filter obtained by this multiplication process is a filter which reflects the gain change made by the user. Note that if the gain difference is 0 dB, the process of multiplying the coefficient of the preceding filter by the gain difference multiplied by the weighting factor information is not performed. The gain coefficient generator 140 then stores the obtained filter (new filter) in the filter coefficient memory 230 and gain coefficient memory 150 (step S.12 in FIG. 2).

More detailed description will be made using an example. As with that of the frequency spectrum signal, the filter of the present embodiment is 8,193 points. The coefficients of the initial filter, that is, the coefficients of yet-to-be-corrected filter are all 1 (1 in linear; 0 dB in decibels), and the gain values of the bands are 0 dB. This filter is stored in the gain coefficient memory 150 as a preceding filter, and these gain values are stored in the gain coefficient memory 150 as preceding gain values so as to be associated with the bands.

If the user operates the operation unit 113 of the frequency-gain setting unit 110 in this state to set the gain of a 400 Hz band to 10 dB, the difference (gain difference) between the preceding gain value 0 dB and the updated new gain value 10 dB is 10 dB. The gain coefficient generator 140 multiplies the weighting factor information shown in FIG. 4(*a*) and the gain difference 10 dB (multiplies the weighting factor information by 10 times) and then converts the multiplication value in decibels into a linear value. The gain coefficient generator 140 then generates a new filter by reading the preceding filter (initial filter, that is, yet-to-be-corrected filter) stored in the gain coefficient memory 150 and multiplying the coefficient of the read preceding filter by the multiplication result (correction gain) obtained by multiplying the weighting factor information and the gain difference and then converting the resulting value into a linear value.

Figure 5A:
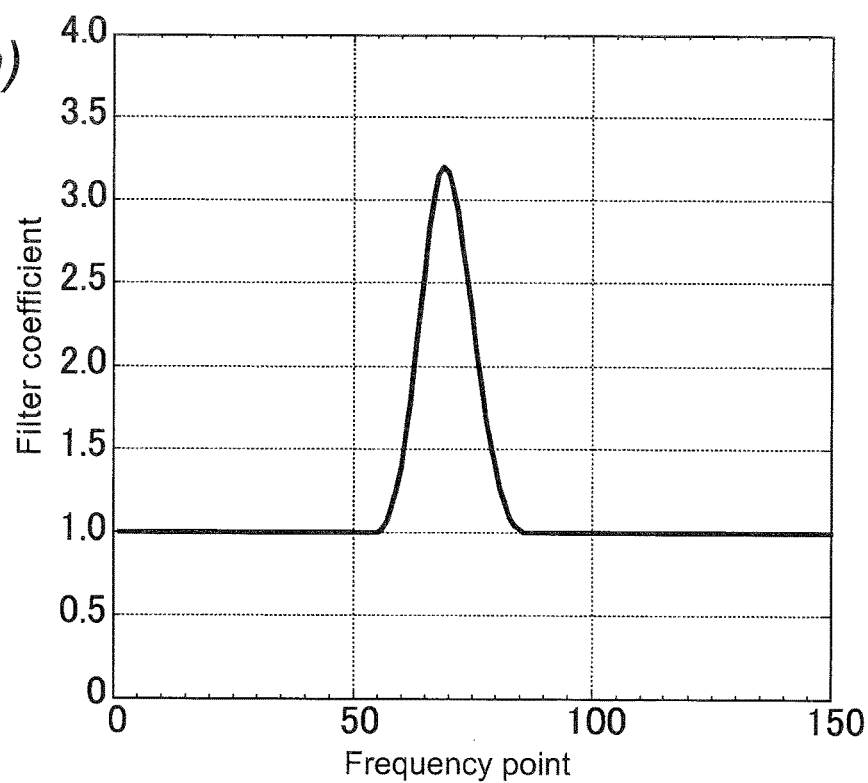
FIG. 5($a$) and FIG. 5($b$) includes diagrams showing an example of a new filter of the embodiment.
Figure 5B:
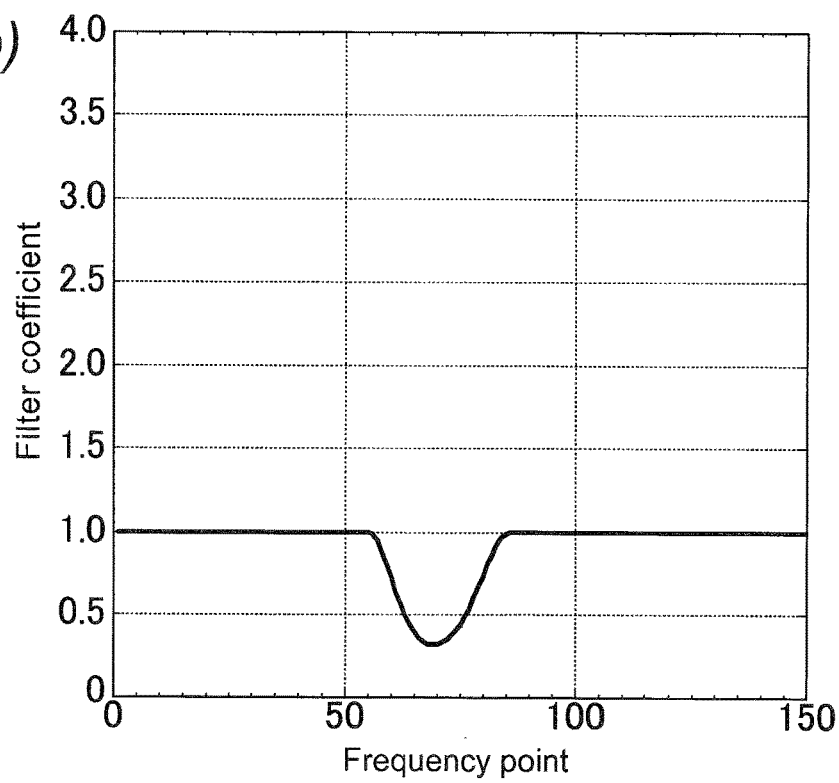

As shown in FIG. 4(*a*), the frequency range of the weighting factor information of the band whose center frequency is 400 Hz is a range of 315 Hz to 500 Hz. Of the read preceding filter, only this frequency range of 315 Hz to 500 Hz is corrected by the multiplication, and the other bands are not affected. FIG. 5(*a*) shows 150 points (frequency points) corresponding to a frequency range of 0 Hz to 879 Hz extracted from 8,193 points (frequency points) described above, and the corresponding filter (new filter), which has been corrected by the multiplication. As described above, the coefficient value of the filter is multiplied by the gain difference 10 dB, that is, multiplied by 10 times by the gain coefficient generator 140, but it becomes about 3.2 by linear conversion and the like.

As seen above, the gain coefficient generator 140 generates a new filter by multiplying only the coefficient of a frequency band selected by the user, of the preceding filter stored in the gain coefficient memory 150 by the multiplication result (correction gain) obtained by multiplying the weighting factor information of the respective frequency bands previously stored in the weighting factor memory 130 and the gain difference. That is, the gain coefficient generator 140 corrects (multiplies) only the coefficient of the band set by the user using the correction gain and thus updates the FIR filter (preceding filter). Thus, the filter generator 100 is able to reduce the processing load required for purposes such as the generation of a new filter and to effectively reduce the processing time. The gain coefficient generator 140 then stores the filter that has corrected only the range of 315 Hz to 500 Hz, in the gain coefficient memory 150 and filter coefficient memory 230 as a new filter.

Next, there will be described a case where after setting the gain of the 400 Hz band to 10 dB, the user further changes the gain to −10 dB. The gain difference between the newly set gain value (new gain value) −10 dB and the gain value (preceding gain value) 10 dB set in the previous process is −20 dB. In this case, the gain coefficient generator 140 multiplies the weighting factor information shown in FIG. 4(*a*) by the gain difference −20 dB (multiplies the weighting factor information by −20 times) and then converts the multiplication value in decibels into a linear value. The gain coefficient generator 140 then generates a new filter by reading the preceding filter stored in the gain coefficient memory 150 (as described above, the filter, which has been corrected only the band of 315 Hz to 500 Hz) and multiplying the coefficient of the read preceding filter by the multiplication result (correction gain) obtained by multiplying the weighting factor information by the gain difference −20 dB and converting the resulting value into a linear value.

FIG. 5(*b*) shows 150 points corresponding to a frequency range of 0 Hz to 879 Hz extracted from 8,193 points described above, and the corresponding filter, which has been corrected on the basis of the gain difference −20 dB. The new filter shown in FIG. 5(*b*) is obtained from the multiplication of the coefficient of the filter by a factor of −20 by the gain coefficient generator 140, but the coefficient value of the new filter is about 0.3. This is because the coefficient of the preceding filter stored in the gain coefficient memory 150 is a positive value as shown in FIG. 5(*a*) and the coefficient of the filter multiplied by a factor of −20 has been converted into a linear value. By calculating the new filter in this manner, the filter generator 100 is able to reduce the processing load of calculation required to generate an FIR filter and to effectively reduce the processing time.

Figure 6A:
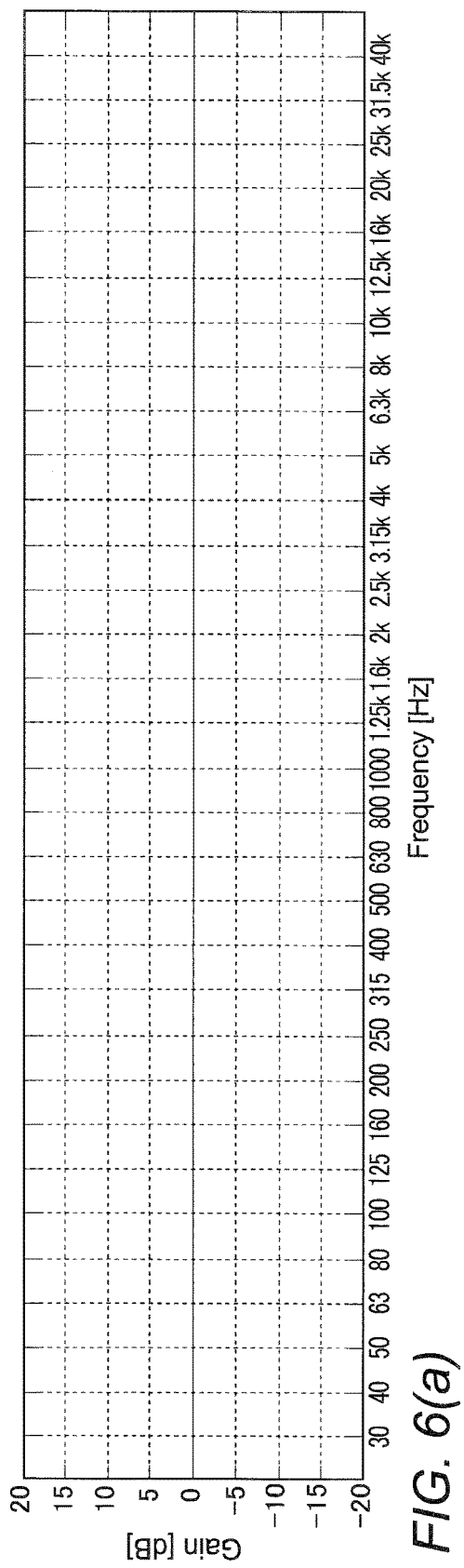
FIG. 6($a$) shows an example display of the display unit in the initial state.
Figure 6B:
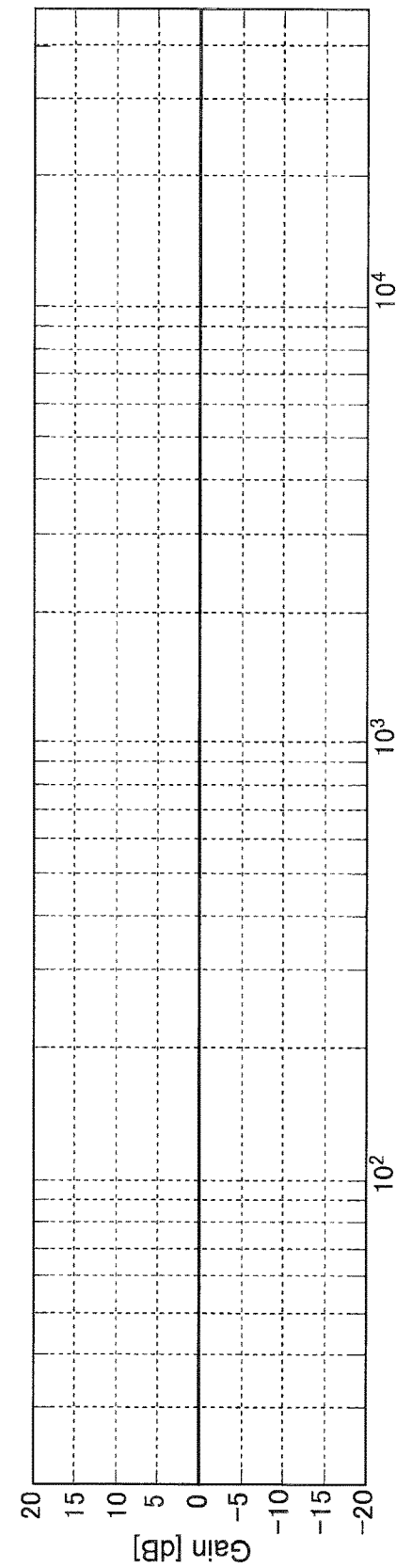
Figure 7A:
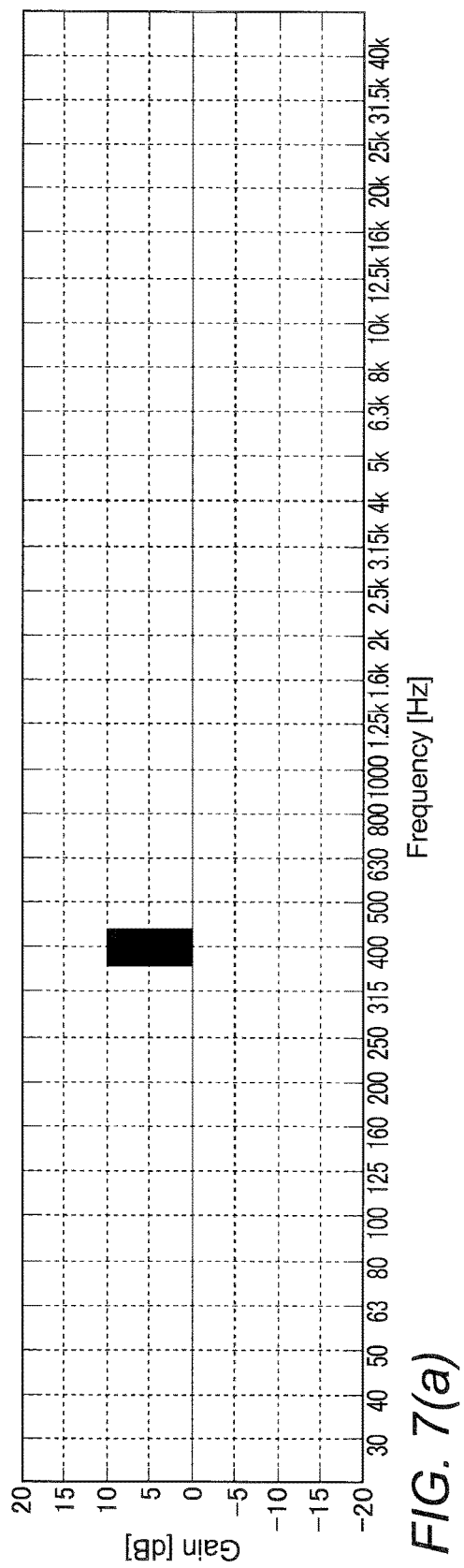
FIG. 7($a$) shows an example display of the display unit when the gain of a 400 Hz band is set to 10 dB.
Figure 7B:
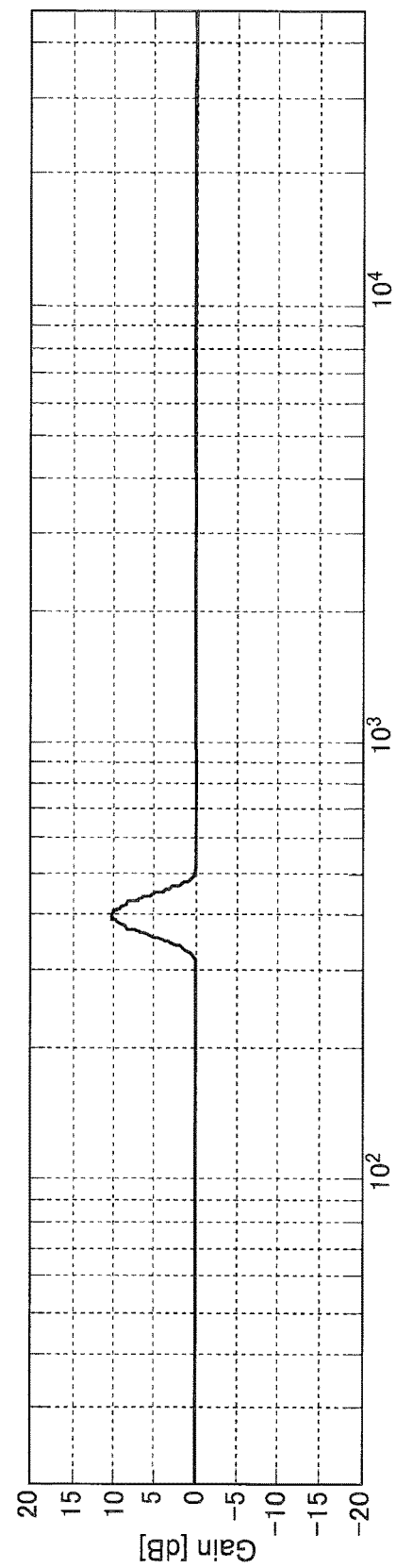

FIGS. 6(*a*), 7(*a*), and 8(*a*) show displays on the display unit 112, in which FIG. 6(*a*) shows an initial state in which no gain setting has been made on the display unit 112; FIG. 7(*a*) shows a state in which the gain of the 400 Hz band has been set to 10 dB on the basis of an operation of the operation unit 113 by the user; and FIG. 8(*a*) shows a subsequent state in which the gain of the 400 Hz band has been changed to −10 dB. FIGS. 6(*b*), 7(*b*), and 8(*b*) show the frequency characteristics of the respective filters corresponding to the display states shown in FIGS. 6(*a*), 7(*a*), and 8(*a*).

As shown in FIG. 6(*a*), if the gain is set to 0 dB on the display unit 112, the gain of any frequency band has yet to be corrected. For this reason, as shown in FIG. 6(*b*), the coefficient of a new filter of any frequency band calculated by the gain coefficient generator 140 is 0 dB (1 in linear). In other words, an acoustic signal outputted from the sound source is outputted from a speaker or the like without being gain-corrected.

Figure 8A:
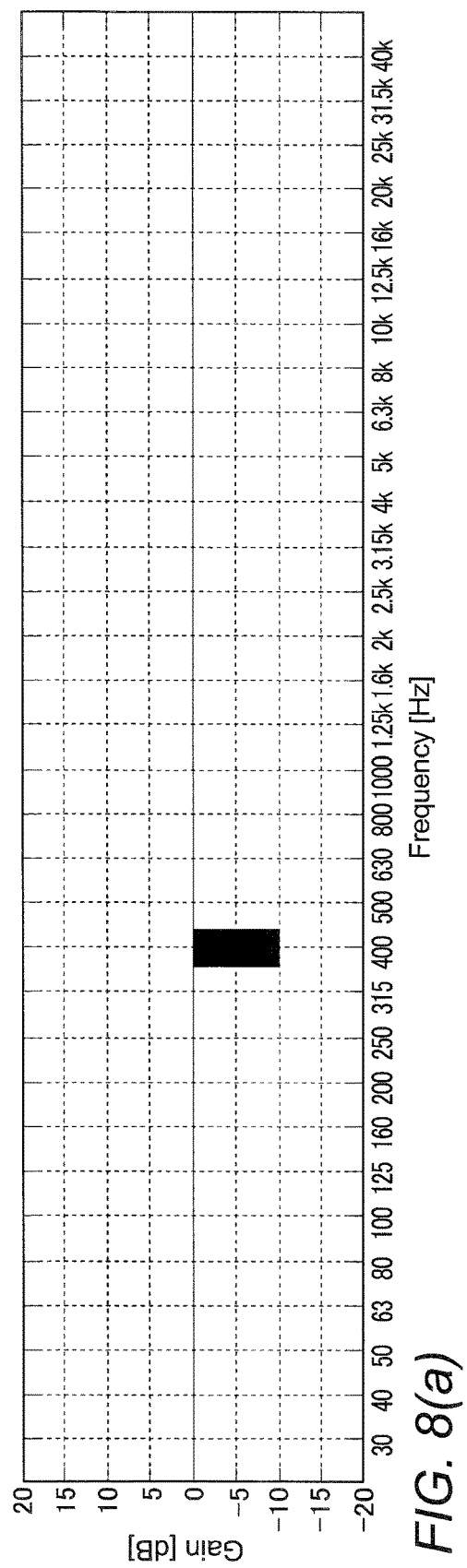
FIG. 8($a$) shows an example display of the display unit when the gain of the 400 Hz band is set to −10 dB.
Figure 8B:
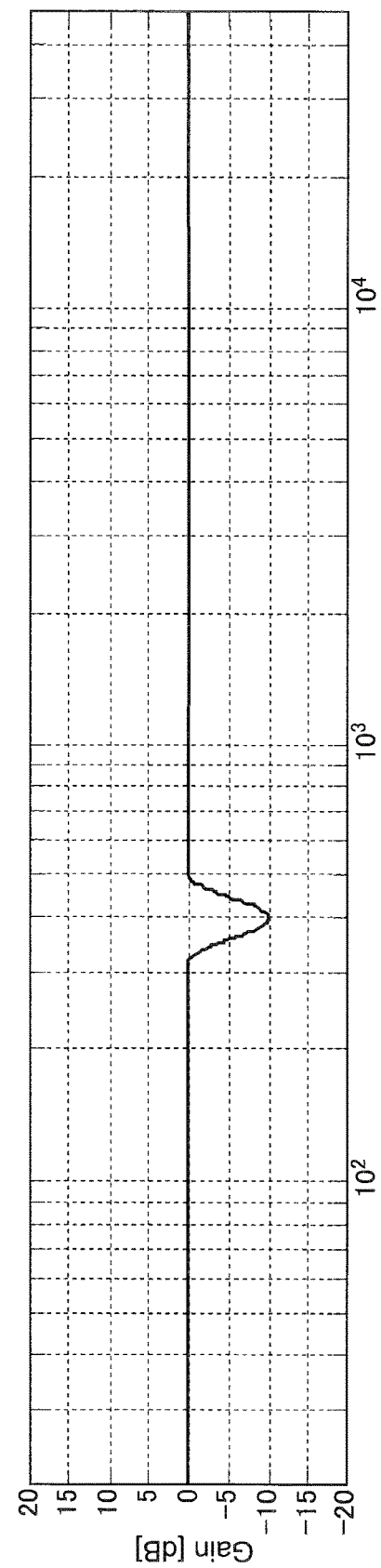

If the user sets the gain of the 400 Hz band to 10 dB as shown in FIG. 7(*a*) in the state in which any gain has yet to be corrected as described above, the coefficient of the new filter is changed, and the gain of the 400 Hz band is increased to 10 dB, as shown in FIG. 7(*b*). In the graphs of the filter shown in FIGS. 6(*b*), 7(*b*), and 8(*b*), the horizontal axis is a log scale represented by the frequency (Hz), and the vertical axis is a decibel scale. If the horizontal axis of the filter is represented by a log scale, the graph of the filter has a horizontally symmetrical shape centered on 400 Hz. This filter shape corresponds to the characteristics of the weighting factor information stored in the weighting factor memory 130. In the present embodiment, this filter shape corresponds to the characteristics of the Hann window. If the gain of the 400 Hz band is set to −10 dB as shown in FIG. 8(*a*), the coefficient of the new filter is changed, and the gain of the 400 Hz band is reduced to −10 dB as shown in FIG. 8(*b*). This filter shape also corresponds to the characteristics of the Hann window, which are the characteristics of the weighting factor information.

Figure 3B:
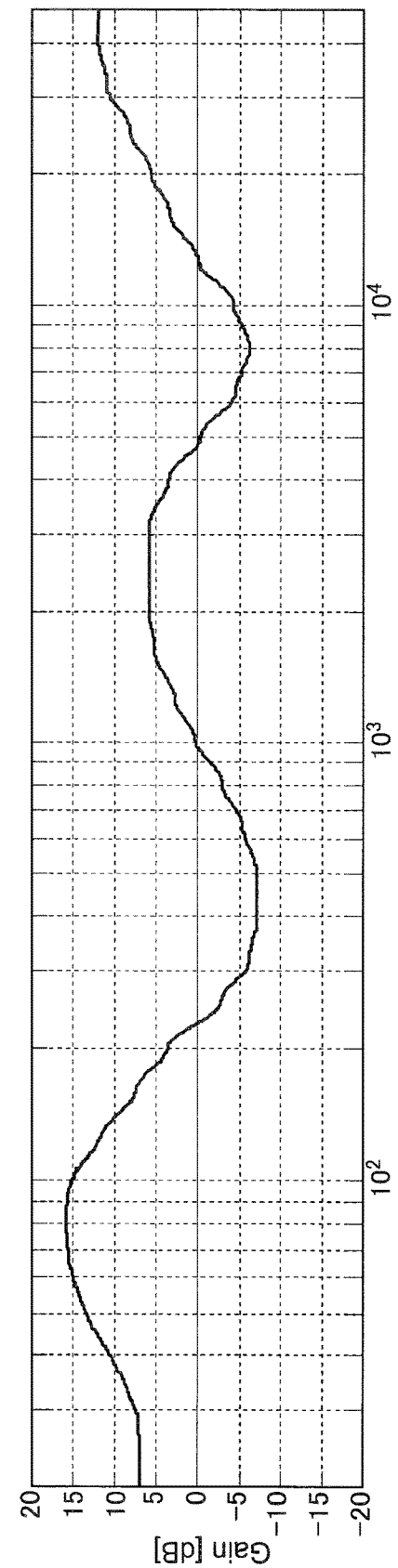

If the user operates the operation unit 113 to set the gains of the frequency bands to desired values as shown in FIG. 3(*a*), the gain coefficient generator 140 calculates new filter characteristics as shown in FIG. 3(*b*). That is, even if the user operates the operation unit 113 to set the gains of the frequency bands in such a manner that the gains continuously change as shown in FIG. 3(*a*), the gain coefficient generator 140 is able to calculate a new filter corresponding to the set gains as shown in FIG. 3(*b*). As is apparent in FIGS. 3(*a*) and 3(*b*), if the gains of multiple frequency bands are set to desired values, the filter generator 100 is able to minimize the influence on the gains of the bands adjacent to the band for which the gain has been set. This is because the weighting factor information of the 32 frequency bands stored in the weighting factor memory 130 is set in such a manner that the amplitude value of the center frequency is set to 1; the amplitude values of the frequencies serving as the boundaries are set to 0.5; the amplitude values of the center frequencies of the adjacent bands are set to 0; and the amplitude values of the frequencies continuously change in an approximately convex shape, as shown in FIGS. 4(*a*) and 4(*b*).

By setting the weighting factor information in this manner, it is possible to adjust the gain values in such a manner that the gain value of the central portion of the band is reliably increased or reduced and the gain values of the adjacent left and right bands are not affected by the changed gains. Since the amplitude values of the frequencies serving as the boundaries are 0.5, it is possible to change the gains while causing the change states of the gains of the boundaries to correspond to the change state of the gain of the central portion of the band, as well as considering the change states of the gains of the adjacent bands. Thus, even if different gains are set for the frequency bands, the change states of the gains of the boundaries can be adjusted to states that do not cause a feeling of strangeness. As a result, as shown in FIG. 3(*a*), even if different gains are set for multiple frequency bands, the gain values can be adjusted independently of each other in such a manner that the adjacent bands are hardly affected.

While, in the present embodiment, the weighting factor information stored in the weighting factor memory 130 has a shape based on the attenuation curve of the Hann window, the attenuation curve of the weighting factor information is not limited to the attenuation curve of the Hann window. For example, by using the attenuation curve of a quarter window, the filter characteristics of the Hann window as shown in FIG. 7(*b*) or 8(*b*) can be changed to the filter characteristics of the quarter window. Even if weighting factor information is selected as appropriate as described above, the state of a generated filter can be changed to filter characteristics including gain variations that are continuous as a whole while suppressing the influence on the gain variations of the adjacent bands, as long as the weighting factor information is set in such a manner that the amplitude value of the center frequency is set to 1; the amplitude values of the frequencies serving as the boundaries are set to 0.5; the amplitude values of the center frequencies of the adjacent bands are set to 0; and the amplitude values of the frequencies continuously change in an approximately convex shape. By selecting weighting factor information as appropriate as described above, the filter characteristics serving as a base can be changed.

As described above, the filter generator 100 of the present embodiment calculates the correction gain (the gain difference multiplied by the weighting factor information) of the filter of the band selected by the user by multiplying the weighting factor information of the band selected by the user stored in the weighting factor memory 130 by the gain difference based on the gain value set by the user and then multiplies the coefficient of the preceding filter by the calculated correction gain. Thus, the filter generator 100 is able to generate the FIR filter (new filter) corresponding to the setting of the user. As a result, the sound field corrector 200 is able to perform a filtering process using the FIR filter calculated on the basis of the setting of the user and to improve the accuracy of a filter calculation in a sound correction process.

The filter generator 100 is also able to calculate the correction gains of the respective bands by multiplying the weighting factor information of the bands by the gain differences and to easily generate the FIR filter (new filter) by multiplying the coefficient of the preceding filter by the correction gains. Thus, the filter generator 100 is able to reduce the processing load for generating (calculating) an FIR filter and to significantly reduce the processing time.

Also, the filter generator 100 sets the weighting factor information of the respective bands in such a manner that the amplitude value of the center frequency is set to 1; the amplitude values of the frequencies serving as the boundaries are set to 0.5; the amplitude values of the center frequencies of the adjacent bands are set to 0; and the amplitude values continuously change in an approximately convex shape and then calculates the new filter on the basis of the weighting factor information set for the respective bands and the gain differences based on the gains set by the user. Thus, even if the gain of a particular band is set or changed, the filter generator 100 is able to minimize the influence on the gain values of the adjacent bands and to prevent a trough based on the gain value from occurring in the adjacent bands like when an IIR filter is used. Thus, the filter generator 100 is able to accurately reproduce the gain characteristics of the respective frequency bands set by the user using the new filter, allowing sound correction to be accurately performed.

While the filter generator 100 of the present embodiment has been described as an example of the filter generator of the present invention, the filter generator of the present invention is not limited thereto. It is apparent that those skilled in the art can conceive of various changes and modifications thereto without departing from the scope set forth in the claims. Similar configurations that produce similar effects or the like also can be determined to fall within the technical scope of the present invention.

For example, as shown in FIG. 1, the filter generator 100 may include the CPU 300, memory 310, display unit 112, and operation unit 113. In this case, a program indicating a process performed by the CPU 300 may be stored in the memory 310, and the CPU 300 may implement the functions of the weighting factor selector 120, gain coefficient generator 140, and frequency-gain setting unit 110 by reading the program from the memory 310 and executing it. It can be determined that when the memory 310 functions as the weighting factor memory 130 and gain coefficient memory 150, the CPU 300, memory 310, display unit 112, and operation unit 113 perform substantially the same process as that performed by the filter generator 100 described in the embodiment.

If the CPU 300 performs the process on the basis of the program as described above, the process shown in FIG. 2 indicates the process performed by the CPU 300. In this case, the flowchart shown in FIG. 2 corresponds to the process of the program for performing the functions described in the embodiment using the CPU 300, as well as shows the processing method performed by the CPU 300. For this reason, the configuration and process of the filter generator 100 of the embodiment also serve as an example of a filter generation method and filter generation program of the present invention.

In the embodiment, it has been stated that the frequency-gain setting unit 110 of the filter generator 100 may be a touchscreen or the like. At the present time, there are a variety of information terminals that are operated through a touchscreen, such as smartphones or tablet terminals. For this reason, for example, the processes performed by the frequency-gain setting unit 110, weighting factor selector 120, and gain coefficient generator 140 of the filter generator 100 can be performed by a CPU in a smartphone, tablet terminal, or the like. The memory such as the weighting factor memory 130 or gain coefficient memory 150 can be used as a memory in a smartphone, tablet terminal, or the like. As seen above, the functions of the filter generator 100 described above can be easily performed by a smartphone, tablet terminal, or the like.

After a new filter is calculated by a smartphone, tablet terminal, or the like, the filter may be transmitted and stored to the filter coefficient memory 230 of the sound field corrector 200 using a network (e.g., Wi-Fi (wireless fidelity) or Bluetooth®). If the sound field corrector 200 is a car-mounted audio system or the like different from a smartphone, tablet terminal, or the like, the functions and effects described in the embodiment can be easily obtained. Also, the filter generator 100 and sound field corrector 200 may be formed integrally in a car-mounted audio system or the like. In this case also, the functions and effects described in the embodiment can be obtained.

While, in the embodiment, the weighting factor information stored in the weighting factor memory 130 is set in such a manner that the amplitude value of the center frequency is set to 1; the amplitude values of the frequencies serving as the boundaries are set to 0.5; the amplitude values of the center frequencies of the adjacent bands are set to 0; and the amplitude values of the frequencies continuously change in an approximately convex shape, the weighting factor information need not necessarily have such a shape (data state).

For example, even if all the amplitude values in the band width are 1, an FIR filter can be generated by calculating a new filter on the basis of the weighting factor information of the respective divided bands and the gain differences. Thus, it is possible to reduce the processing load for generating (calculating) an FIR filter and to significantly reduce the processing time. In this case, the sequence of coefficients of the generated new filter may change roughly in accordance with the frequency change. However, the roughness can be reduced by adjusting, for example, the number of divided bands.

Also, while the weighting factor information is set in such a manner that the amplitude values of the frequencies continuously change in an approximately convex shape, the amplitude values need not necessarily be set in such a manner that the amplitude value of the center frequency is set to 1; the amplitude values of the frequencies serving as the boundaries are set to 0.5; and the amplitude values of the center frequencies of the adjacent bands are set to 0. For example, not the amplitude values of the center frequencies of the adjacent bands but the amplitude values of frequencies closer to the band selected by the user, of the adjacent bands may be set to 0. Even if an approximately convex, mountainous frequency width is narrowed as described above, a new filter which minimizes the influence on the gain values of the adjacent frequency bands can be generated as long as weighting factor information is formed from amplitude values that continuously change in an approximately convex shape. Thus, a trough based on the gain values can be prevented from occurring in the adjacent bands like when an IIR filter is used.

While, in the embodiment, the band information detected by the frequency-gain setting unit 110 is transmitted to the gain coefficient generator 140 through the weighting factor selector 120, the band information need not necessarily be transmitted to the gain coefficient generator 140 through the weighting factor selector 120. As with a new gain value, the weighting factor information may be directly transmitted from the frequency-gain setting unit 110 to the gain coefficient generator 140. Also, a new gain value detected by the frequency-gain setting unit 110 may be transmitted from the frequency-gain setting unit 110 to the gain coefficient generator 140 through the weighting factor selector 120 rather than being directly transmitted from the frequency-gain setting unit 110 to the gain coefficient generator 140.

In the embodiment, "the step in which the frequency-gain setting unit 110 determines whether the user has newly selected a frequency band and set or changed the gain, on the basis of an operation of the operation unit 113 by the user (step S.1 in FIG. 2)" has been described as an example. Also, it has been stated that "the frequency-gain setting unit 110 may periodically (at predetermined time intervals) determine whether the user has newly selected a frequency band and set or changed the gain." However, the periodically repeated step is not necessarily limited to "the step in which the frequency-gain setting unit 110 determines whether the user has newly selected a frequency band and set or changed the gain (step S.1 in FIG. 2)." The series of steps performed by the weighting factor selector 120, gain coefficient generator 140, and the like may be periodically repeatedly performed.

For example, if the steps performed by the function units (frequency-gain setting unit 110, weighting factor selector 120, and gain coefficient generator 140) shown in FIG. 2 are periodically repeatedly performed, the steps shown in FIG. 2 are performed as a type of interrupts. For this reason, even if the user has not selected a frequency band or set or changed the gain within a predetermined time, step S.2 and later steps are automatically performed by repeatedly detecting the preceding frequency band and gain value, and after a predetermined time elapses (at predetermined time intervals), the steps shown in FIG. 2 are repeatedly performed. The predetermined time intervals may be any time intervals. For example, by making a setting such that an interrupt is performed every 0.1 sec, the steps shown in FIG. 2 can be performed with no delay without preventing the user from smoothly operating the operation unit 113.

REFERENCE SIGNS LIST 100 filter generator
110 frequency-gain setting unit (input detection unit)
112 display unit
113 operation unit
114 horizontal button
115 vertical button
120 weighting factor selector (weighting factor extraction unit)
130 weighting factor memory (weighting factor storage unit)
140 gain coefficient generator (gain difference calculation unit, correction gain generation unit, filter coefficient calculation unit)
150 gain coefficient memory (gain coefficient storage unit)
200 sound field corrector
210 FFT unit
220 frequency filtering unit
230 filter coefficient memory
240 IFFT unit
300 CPU
310 memory

The invention claimed is:

1. A filter generator that generates a filter for performing a sound correction process on an audio signal by fast-Fourier-transforming, then filtering, and inverse-fast-Fourier-transforming the audio signal, the filter generator comprising:
a weighting factor storage unit configured to store weighting factor information used to perform the sound correction process, for each of a plurality of bands obtained by dividing a frequency band of the audio signal;
a gain coefficient storage unit configured to store preceding gain values of the divided bands set by a user before a preceding sound correction process and a preceding filter used in the preceding sound correction process;
an input detection unit configured to detect a band selected by the user, of the divided bands as band information and to detect a new gain value newly set by the user for the selected band;
a weighting factor extraction unit configured to extract weighting factor information of the band selected by the user from the weighting factor storage unit on the basis of the band information detected by the input detection unit;
a gain difference calculation unit configured to calculate, as a gain difference, a difference between a preceding gain value of the band obtained from the band information, of the preceding gain values stored in the gain coefficient storage unit and the new gain value detected by the input detection unit;
a correction gain generation unit configured to generate a correction gain of the band obtained from the band information by multiplying the weighting factor information extracted by the weighting factor extraction unit and the gain difference calculated by the gain difference calculation unit; and
a filter coefficient calculation unit configured to generate a new filter by multiplying a coefficient of the band obtained from the band information, of the preceding filter stored in the gain coefficient storage unit by the correction gain generated by the correction gain generation unit.

2. The filter generator according to claim 1, wherein the weighting factor information is set in such a manner that an amplitude value of a center frequency of each of the divided bands is set to a maximum value; and amplitude values become lower at more distant frequencies from the center frequency and show a convex amplitude value change state.

3. The filter generator according to claim 2, wherein if a frequency is represented by a log scale, the convex amplitude value change state has a horizontally symmetrical shape in the weighting factor information.

4. The filter generator according to claim 2, wherein the weighting factor information is set in such a manner that an amplitude value of a center frequency of an adjacent band is set to 0; and an amplitude value of a frequency serving as a boundary with the adjacent band is set to an amplitude value that is half of the maximum value.

5. The filter generator according to claim 2, wherein the weighting factor information has attenuation characteristics corresponding to a Hann window or quarter window as the convex amplitude value change state.

6. A filter generation method used by a filter generator that generates a filter for performing a sound correction process on an audio signal by fast-Fourier-transforming, then filtering, and inverse-fast-Fourier-transforming the audio signal, the filter generator comprising:
a weighting factor storage unit configured to store weighting factor information used to perform the sound correction process, for each of a plurality of bands obtained by dividing a frequency band of the audio signal; and
a gain coefficient storage unit configured to store preceding gain values of the divided bands set by a user before a preceding sound correction process and a preceding filter used in the preceding sound correction process,
the method comprising:
an input detection step of detecting, by an input detection unit, a band selected by the user, of the divided bands as band information and detecting a new gain value newly set by the user for the selected band;
a weighting factor extraction step of extracting, by a weighting factor extraction unit, weighting factor information of the band selected by the user from the weighting factor storage unit on the basis of the band information detected in the input detection step;
a gain difference calculation step of calculating, by a gain difference calculation unit, a difference between a preceding gain value of the band obtained from the band information, of the preceding gain values stored in the gain coefficient storage unit and the new gain value detected in the input detection step, as a gain difference;
a correction gain generation step of generating, by a correction gain generation unit, a correction gain of the band obtained from the band information by multiplying the weighting factor information extracted in the weighting factor extraction step and the gain difference calculated in the gain difference calculation step; and
a filter coefficient calculation step of generating, by a filter coefficient calculation unit, a new filter by multiplying a coefficient of the band obtained from the band information, of the preceding filter stored in the gain coefficient storage unit by the correction gain generated in the correction gain generation step.

7. The filter generation method according to claim 6, wherein the weighting factor information is set in such a manner that an amplitude value of a center frequency of each of the divided bands is set to a maximum value; and amplitude values become lower at more distant frequencies from the center frequency and show a convex amplitude value change state.

8. The filter generation method according to claim 7, wherein if a frequency is represented by a log scale, the convex amplitude value change state has a horizontally symmetrical shape in the weighting factor information.

9. The filter generation method according to claim 7, wherein the weighting factor information is set in such a manner that an amplitude value of a center frequency of an adjacent band is set to 0; and an amplitude value of a frequency serving as a boundary with the adjacent band is set to an amplitude value that is half of the maximum value.

10. The filter generation method according to claim 7, wherein the weighting factor information has attenuation characteristics corresponding to a Hann window or quarter window as the convex amplitude value change state.

* * * * *